United States Patent
Lynch et al.

(10) Patent No.: US 7,242,518 B1
(45) Date of Patent: Jul. 10, 2007

(54) STANDING WAVE AMPLIFIERS AND OSCILLATORS

(75) Inventors: Jonathan J. Lynch, Oxnard, CA (US); Daniel F. Sievenpiper, Santa Monica, CA (US); Joseph S. Colburn, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/378,750

(22) Filed: Mar. 17, 2006

(51) Int. Cl.
 *H01S 3/00* (2006.01)
 *H03F 3/60* (2006.01)
(52) U.S. Cl. ...................... 359/333; 330/286
(58) Field of Classification Search ............ 343/754; 333/125; 330/286; 359/333
 See application file for complete search history.

(56) References Cited

U.S. PATENT DOCUMENTS 5,900,965 A * 5/1999 Matkin et al. ............... 359/283
6,396,449 B1 * 5/2002 Osterhues et al. ........... 343/754
6,750,999 B1 * 6/2004 Chiao ......................... 359/237

OTHER PUBLICATIONS

DeLisio, M.P., et al., "A. 44-60Ghz monolithic pHEMT grid amplifier", *1996 IEEE MTT-S Int. Microwave Symposium Digest*, pp. 1127-1130 (1996).
Shiroma, W.A., et al., "A 100 Transistor Quadruple Grid Oscillator", *IEEE Microwave and Guided Wave Lett.*, vol. 4, No. 10, pp. 350-351 (Oct. 1994).
Shiroma, W.A., et al., "Three-Dimensional Power Combiners", *1994 IEEE MTT-S Int. Microwave Symposium Digest*, pp. 831-834 (1994).

* cited by examiner

*Primary Examiner*—Mark Hellner
(74) *Attorney, Agent, or Firm*—Ladas & Parry

(57) ABSTRACT

An apparatus and method for building three-dimensional spatial power combiners for efficiently combining power from a large number of active devices are being disclosed. The apparatus discloses a plurality of grid amplifiers, each having a major surface, the plurality of grid amplifiers are arranged along an axis that is perpendicular to the major surface of each grid amplifier and spatially separated from each other by a selected resonant distance to generate a standing wave between adjacent grid amplifiers. The method discloses selecting a plurality of grid amplifiers each having a major surface, arranging the plurality of grid amplifiers along an axis that is perpendicular to the major surface of each grid amplifier, selecting a resonance distance, and spatially separating said plurality of grid amplifiers by the resonant distance to generate a standing wave between adjacent grid amplifiers.

12 Claims, 7 Drawing Sheets

STANDING WAVE AMPLIFIERS AND OSCILLATORS

FIELD

This invention relates to three-dimensional spatial power combiners.

BACKGROUND AND PRIOR ART

Broadband communications, radar and other imaging systems require the generation and transmission of radio frequency ("RF") signals in the microwave and millimeter wave bands. In order to efficiently achieve the levels of output transmission power needed for many-applications at these high frequencies, a technique called "power combining" has been employed, whereby the output power of individual components are coupled, or combined, thereby creating a single power output that is greater than an individual component can supply. Conventionally, power combining has used resonant waveguide cavities or transmission-line feed networks. These approaches, however, have a number of shortcomings that become especially apparent at higher frequencies. First, conductor losses in the waveguide walls or transmission lines tend to increase with frequency, eventually limiting the combining efficiency. Second, these resonant waveguide cavities or transmission-line combiners become increasingly difficult to machine as the wavelength gets smaller. Third, in waveguide systems, each device often must be inserted and tuned manually. This is labor-intensive and only practical for a relatively small number of devices.

Several years ago, "spatial power-combining" was proposed as a potential solution to these problems. Spatial power combining provides enhanced RF efficiency by coupling the components to beams or modes in free space rather than via transmission lines in corporate combining structures.

If components are combined using transmission line circuits there is an upper limit to the number of elements (and hence a limit to the power which can be generated) due to transmission line and combining structure losses that depend on the number of elements in a nonlinear relation or due to the accumulating complexity of the circuit. FIGS. 1a and 1b capture the concepts of corporate and spatial power combining, respectively. FIG. 1a shows a circuit for a corporate combiner of power amplifiers integrated on a planar geometry. It can be seen that as additional elements are added the lengths of transmission line and the number of nodal combining circuits increases. The losses in the added line and combining circuits accumulate. They reduce and eventually eliminate the advantages of the combined power. Hence, it becomes necessary to use a spatially combined architecture as shown in FIG. 1b.

FIGS. 2a, 2b and 2c depict several spatially combined configurations to control the RF EM field of spacefed active arrays. FIG. 2a shows a quasi-optical system using lenses and polarizers to control the RF field. Similar configurations can use an open array with no lenses and may use phase control circuitry in each of the active antenna elements to provide beam control. FIG. 2b portrays an active array inside a waveguide, where the waveguide walls controls the EM field and defines its modal structure. FIG. 2c presents a waveguiding structure controlling EM field, but expanding to allow a larger number of amplifier elements to be combined.

Active arrays for space-fed spatial combining systems have been demonstrated in the two classic array topologies—tile and tray—shown in FIGS. 3a and 3b, respectively. In the case of the tile approach shown in FIG. 3a, two distinct design approaches have been developed, shown in FIGS. 4a and 4b. In the Rutledge "grid" array of FIG. 4a, active devices are integrated at the vertical and horizontal intersections of a metallic mesh. The vertical wires connect either the input circuits or the output circuits of the amplifiers, while the horizontal wires connect the other circuit. An incoming wave can thus be polarized to interact only with the amplifiers input circuits, while the outgoing wave will be orthogonally polarized. Polarizer grids used on either side of the grid array insure isolation between input and output circuits. In the grid array, the active elements are generally spaced much closer than a half wavelength. The entire length of the grid wires act as single antenna elements. In the active antenna array of FIG. 4b, separate antenna elements are integrated directly with active devices or a MMIC amplifier, with each element acting as an independent cell. The array acts as a periodic antenna array with the elements spaced at roughly half wavelength intervals. The EM wave is received on one side of the array, active devices can be placed on either or both sides of the array, and the array radiates on the other side. The antenna elements can be various combinations of patch and slot elements, with the possibility that in some configurations a common ground plane can isolate the input from the output. The tray approach, illustrated in FIG. 3b, uses a tray of end-fire antenna elements, with multiple trays stacked to provide a 2-dimensional array. The tray then acts to receive an input signal, to excite an electrical circuit that runs perpendicular to the plane of the antenna array, and to radiate from the other side of the trays.

Conventional spatial power-combiners do not efficiently combine power from a large number of active devices; do not obtain an equal share of power from each of the active device, irrespective of where the active device is located within the grid, and delivering the sum of the individual contributions to a load; and in high-power, high-frequency applications drawing heat away from spatial power combiners also remains a problem.

To overcome the problem of insufficient heat sinking a three-dimensional power combiner has been proposed as shown in FIGS. 5a and 5b. See W. A. Shiroma, B. L. Shaw and Z. B. Popovic, "Three-Dimensional Power Combiners," 1994 IEEE MTT-S Int. Microwave Symp. Dig., pp. 831–834, May 1994; and W. A. Shiroma, B. L. Shaw and Z. B. Popovic, "A 100-Transistor Quadruple Grid Oscillator," IEEE Microwave and guided Wave Lett., vol. 4, no. 10, pp. 350–351, October 1994. FIG. 5a depicts two planar oscillator grids placed back to back against a dielectric spacer and FIG. 5b depicts four planar oscillator grids separated by dielectric spacers.

However, there is still a need to more efficiently combine power from a large number of active devices. The present description addresses these problems by disclosing a three-dimensional power combiner to efficiently combine power from a large number of active devices (e.g. transistors, negative resistance diodes) in a series manner while obtaining an equal share of power from each active device, independent of where the active device is located along the series chain, and delivering the sum of the individual contributions to a load.

BRIEF DESCRIPTION OF THE FIGURES

FIG. 4a depicts a Rutledge "grid" for a "tile" topology shown in FIG. 3a;

FIG. 4b depicts a conventional antenna array design for a "tile" topology shown in FIG. 3a;

DETAILED DESCRIPTION

According to the present disclosure a three-dimensional power combiner may be constructed to efficiently combine power from a large number of active devices (e.g. transistors, negative resistance diodes) in a series manner while obtaining an equal share of power from each active device, independent of where the active device is located along the series chain, and delivering the sum of the individual contributions to a load. Unlike in the prior art, this disclosure utilizes resonance between grids of active devices so that the impedance seen from each active device is equal to all the others, thereby extracting equal power from all active devices.

Figure 1A:
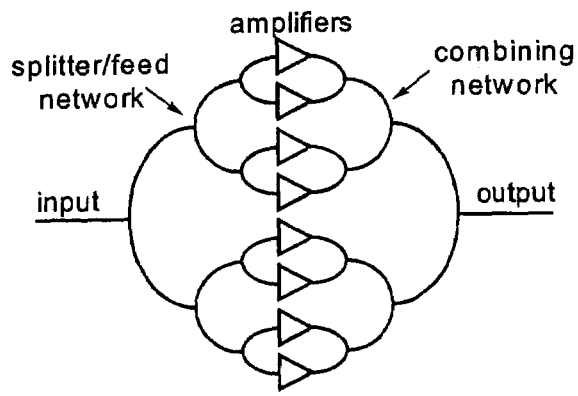
FIG. 1a depicts a conventional corporate combiner using binary Wilkinson splitter/combiner networks.
Figure 1B:
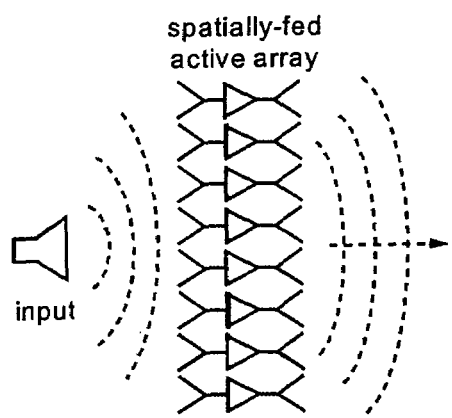
FIG. 1b depicts a special combining architecture.
Figure 2A:
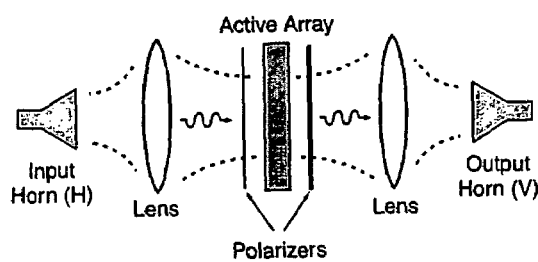
FIG. 2a depicts a quasi-optical beam amplifier concept using a lens-focused arrangement.
Figure 2B:
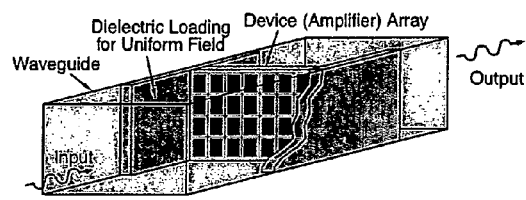
FIG. 2b depicts an active array of amplifier elements inside of a waveguide.
Figure 2C:
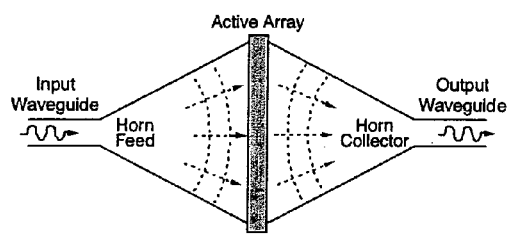
FIG. 2c depicts an active array in oversized waveguide with tapered "horn" feed to accommodate more amplifiers.
Figure 3A:
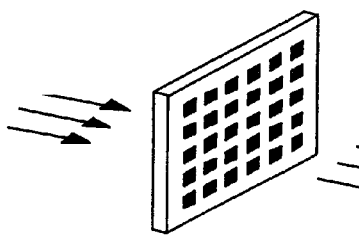
FIG. 3a depicts a "tile" topology of spatial combining systems.
Figure 3B:
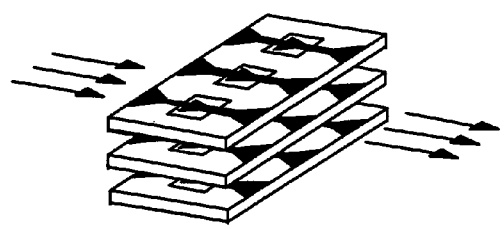
FIG. 3b depicts a "tray" topology of spatial combining systems.
Figure 4A:
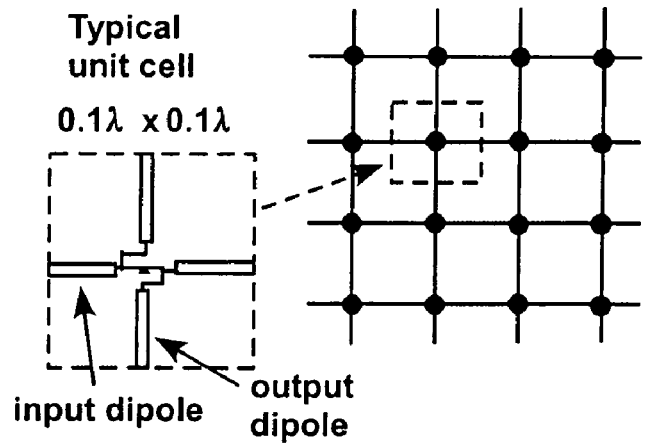
Figure 4B:
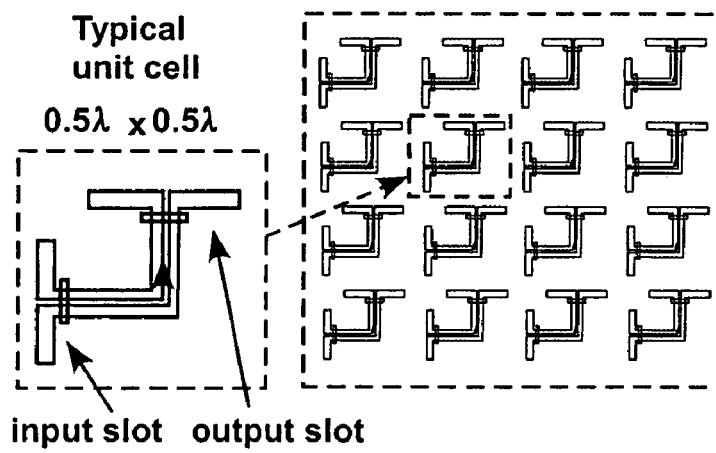
Figure 5A:
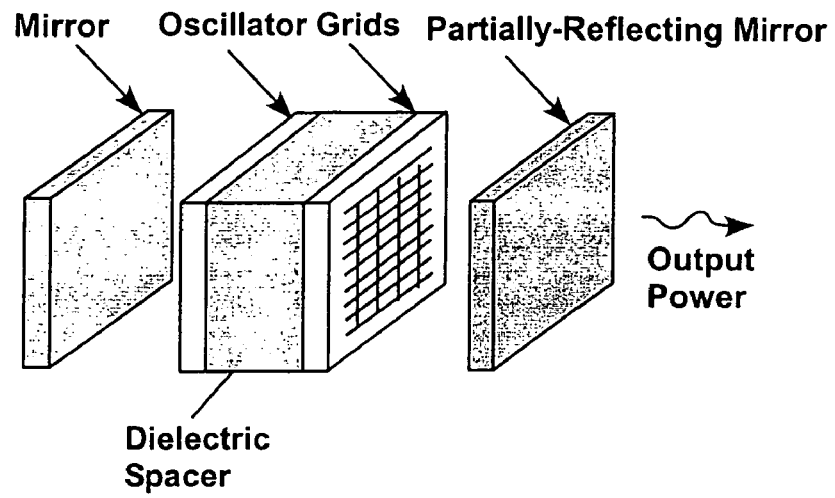
FIG. 5a depicts a three-dimensional power combiner with two planar oscillator grids placed back to back against a dielectric spacer.
Figure 5B:
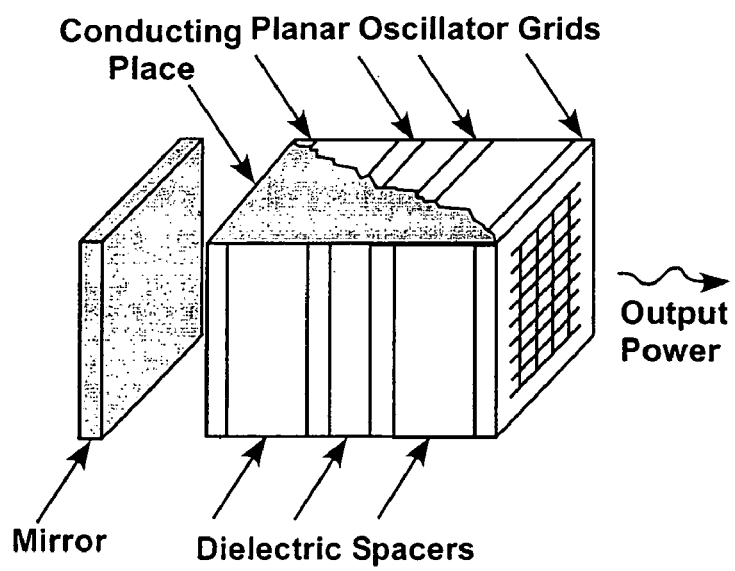
FIG. 5b depicts a three-dimensional power combiner with four planar oscillator grids separated by dielectric spacers.
Figure 6:
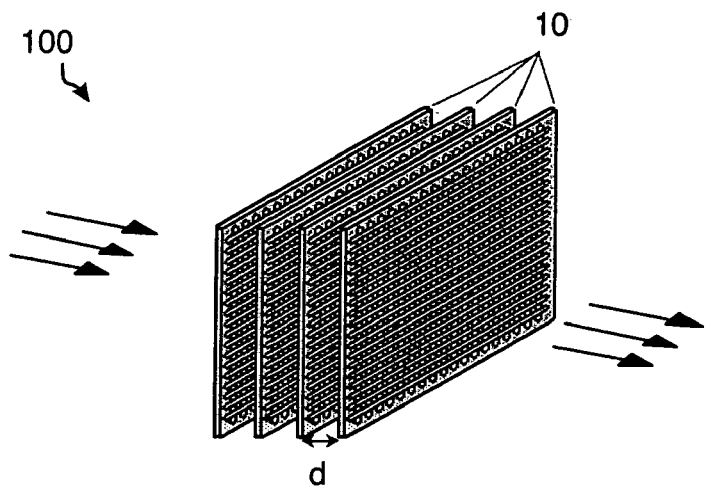
FIG. 6 depicts a three-dimensional power amplifier composed of grid amplifiers separated by a resonant distance θ according to the present disclosure.

Referring to FIG. 6, an exemplary embodiment of a three-dimensional amplifier 100 is composed of four "grid" amplifiers 10 separated by distance d. The grid amplifiers 10 may, for example, contain a two dimensional array of two terminal active devices, such as, for example, IMPATT, Gunn or tunnel diodes or three terminal active devices, such as, for example, FET transistors. The grid amplifiers 10 are well known in the art and are not discussed in great detail herein for clarity purposes. The grid amplifiers are discussed in more detail in "A 44–60 GHz monolithic pHEMT grid amplifier," M. P. DeLisio, S. W. Duncan, D. W. Tu, S. Weinreb, C. M. Liu, D. B. Rutledge, 1996 IEEE MTT-S Int. Microwave Symp. Dig., pp. 1127–1130, 1996, which is incorporated herein by reference.

Figure 7:
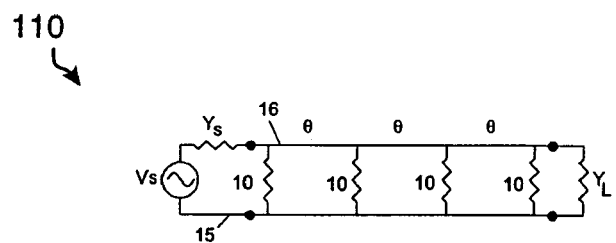
FIG. 7 depicts a schematic diagram of the three-dimensional power amplifier shown in FIG. 6 wherein the grid amplifiers comprise two-dimensional array of two terminal devices.

Referring to FIG. 7, schematic diagram 110 of the three-dimensional amplifier 100 with of grid amplifiers 10 composed of a two dimensional array of two terminal devices is shown. The grid amplifiers 10 are periodically arranged on transmission lines 15 and 16, with a resonant distance θ

$$\left(\theta = kd = n\pi\frac{d}{\lambda}\right)$$

separating the grid amplifiers 10 where d is the physical distance between grid amplifiers 10, k is a propagation constant and is related to wavelength as $$k = \frac{2\pi}{\lambda},$$

and λ is wavelength of the energy to be amplified. According to Circuit theory, separating the grid amplifiers by multiples of half a wavelength effectively placed the grid amplifiers in parallel. Thus each grid "sees" the same external admittance, and therefore delivers the same power to the load, independent of their proximity to the load admittance $Y_L$.

Figure 8:
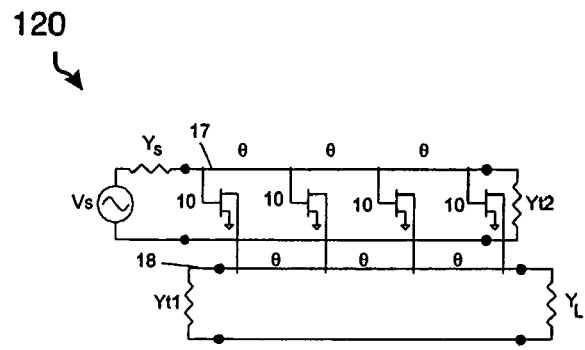
FIG. 8 depicts a schematic diagram of the three-dimensional power amplifier shown in FIG. 6 wherein the grid amplifiers comprise two-dimensional array of three terminal devices.

Referring to FIG. 8, schematic diagram 120 of the three-dimensional amplifier 100 with grid amplifiers 10 composed of a two dimensional array of three terminal devices is shown. There are two sets of loaded transmission lines 17 and 18, one for the input (gate) side and one for the output (drain) side. As above, the lengths of transmission line between grid amplifiers 10 are multiples of half a wavelength so that the inputs and outputs of the three terminal devices in the grid amplifiers 10 appear in parallel. For the gate circuit, this creates equal voltages across all of the gates, and on the drain circuit, power from each of the transistors adds in phase, delivering the sum power to the load $Y_L$.

The three terminal devices in each grid amplifier 10 may have cross polarized inputs and outputs, which may allow each polarization through the three-dimensional amplifier 100 to act like a separate transmission line. The vertical input polarization couples into the grid amplifier 10, delivering a fraction of the power to the three terminal devices, with remainder either reflected back or transmitted through. The power delivered to the three terminal devices is amplified by the three terminal devices and then radiated into the cross polarized component to adjacent grid amplifiers 10. The resonant distance θ between the grid amplifiers 10 creates standing waves between grid amplifiers 10, thus creating equal admittances at each grid amplifiers 10 so that each sources the same power.

This disclosure is not limited to four grid amplifiers 10 within the three-dimensional amplifier 100 as depicted in FIG. 8. One skilled in the art would understand that there could be a plurality of grid amplifiers 10 within the three-dimensional amplifier 100.

Although the above exemplary embodiments disclose amplifiers, the above approach can be used in either an amplifier mode or an oscillator mode, depending on the terminations of the transmission lines. There are a number of methods that one can use to make the structure oscillate. To achieve oscillation one must couple outputs (scattered waves) from layers back to inputs (incident waves) from the same or other layers. When the amount of coupling increases beyond a certain point, determined partly by the gain of the layers, the structure will oscillate. The three-dimensional structure shown in FIG. 6 may be configured as an oscillator array as shown in FIG. 9.

Figure 9:
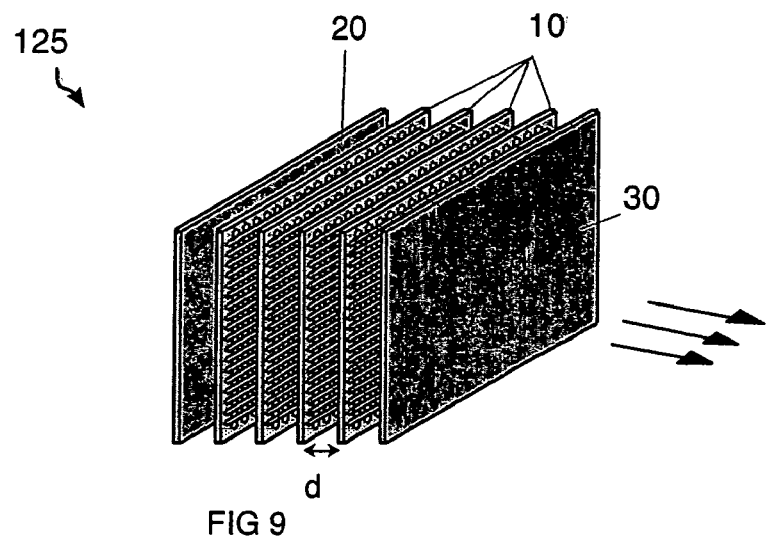
FIG. 9 depicts a three-dimensional oscillator composed of grid amplifiers separated by a resonant distance θ according to the present disclosure.

Referring to FIG. 9, an exemplary embodiment of a three-dimensional oscillator 125 composed of four "grid" amplifiers 10 separated by distance d, total reflector 20 and partial reflector 30 is shown. The total reflector 20 and the partial reflector 30 may be used to terminate sides of the three-dimensional oscillator 125 in order to provide feedback to initiate oscillations. The output of the three-dimensional oscillator 125 consists of the power transmitted through the partial reflector 30. In this embodiment the outputs and input are cross polarized to reduce parasitic coupling between the inputs and outputs.

The grid amplifiers 10 may, for example, contain a two dimensional array of two terminal active devices, such as, for example, IMPATT, Gunn or tunnel diodes or three terminal active devices, such as, for example, FET transistors. As stated above, the grid amplifiers 10 are well known in the art and are not discussed in great detail herein for clarity purposes.

Figure 10:
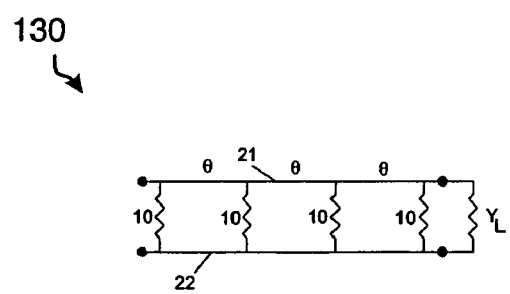
FIG. 10 depicts a schematic diagram of the three-dimensional oscillator shown in FIG. 9 wherein the grid amplifiers comprise two-dimensional array of two terminal devices.

Referring to FIG. 10, schematic diagram 130 of the three-dimensional oscillator 125 with of grid amplifiers 10 composed of a two dimensional array of two terminal devices is shown. The grid amplifiers 10 are periodically arranged on transmission lines 21 and 22, with a resonant distance θ

$$\left(\theta = kd = n\pi\frac{d}{\lambda}\right)$$

separating the grid amplifiers 10 where d is the physical distance between grid amplifiers 10, k is a propagation constant and is related to wavelength as $$k = \frac{2\pi}{\lambda},$$

and λ is wavelength of the energy to be amplified. According to Circuit theory, separating the grid amplifiers by multiples of half a wavelength effectively placed the grid amplifiers in parallel. Thus each grid "sees" the same external admittance, and therefore delivers the same power to the load, independent of their proximity to the load admittance $Y_L$.

Figure 11:
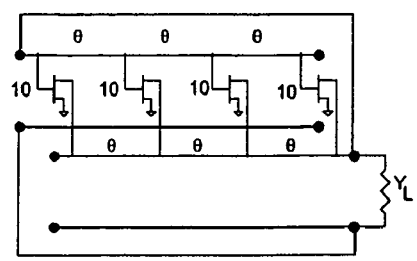
FIG. 11 depicts a schematic diagram of the three-dimensional oscillator shown in FIG. 9 wherein the grid amplifiers comprise two-dimensional array of three terminal devices.

Referring to FIG. 11, schematic diagram 140 of the three-dimensional oscillator 125 with grid amplifiers 10 composed of a two dimensional array of three terminal devices is shown. There are two sets of loaded transmission lines 17 and 18, one for the input (gate) side and one for the output (drain) side. As above, the lengths of transmission line between grid amplifiers 10 are multiples of half a wavelength so that the inputs and outputs of the three terminal devices in the grid amplifiers 10 appear in parallel. For the gate circuit, this creates equal voltages across all of the gates, and on the drain circuit, power from each of the transistors adds in phase, delivering the sum power to the load $Y_L$.

The three terminal devices in each grid amplifier 10 may have cross polarized inputs and outputs, which may allow each polarization through the three-dimensional oscillator 125 to act like a separate transmission line. The vertical input polarization couples into the grid amplifier 10, delivering a fraction of the power to the three terminal devices, with remainder either reflected back or transmitted through. The power delivered to the three terminal devices is amplified by the three terminal devices and then radiated into the cross polarized component to adjacent grid amplifiers 10. The resonant distance between the grid amplifiers 10 creates standing waves between grid amplifiers 10, thus creating equal admittances at each grid amplifiers 10 so that each sources the same power.

This disclosure is not limited to four grid amplifiers 10 within the three-dimensional oscillator 125 as depicted in FIG. 9. One skilled in the art would understand that there could be a plurality of grid amplifiers 10 within the three-dimensional oscillator 125.

This disclosure is not limited to the grid amplifiers 10 and the reflectors 20 and 30 being rectangular shape as depicted in FIG. 9. One skilled in the art would understand that the grid amplifiers 10 and the reflectors 20 and 30 may be other shapes like, for example, circular as depicted in FIG. 12.

Figure 12:
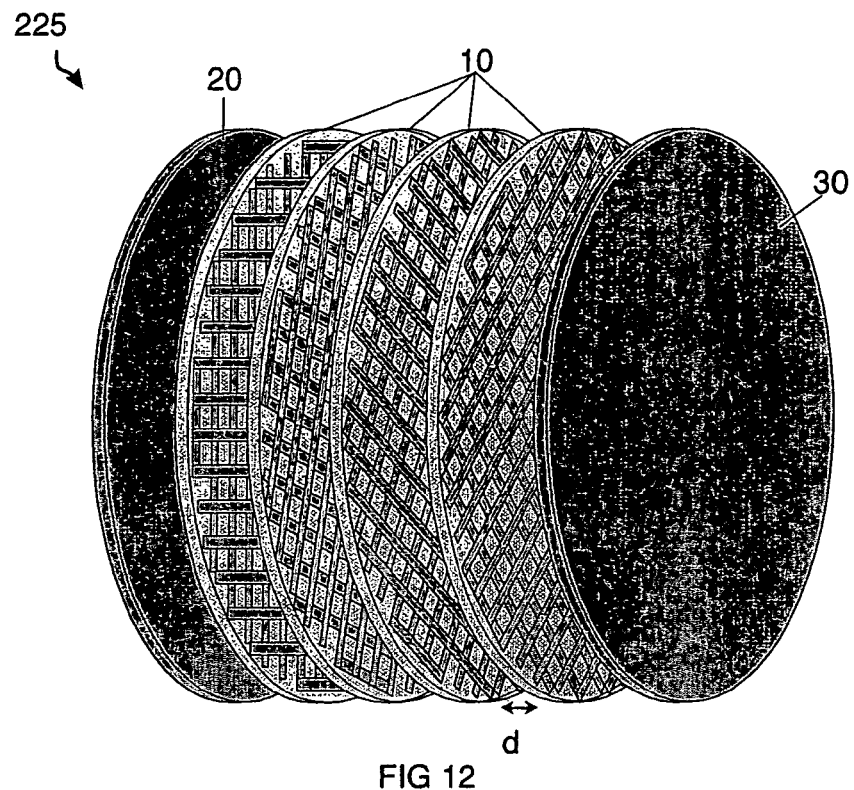
FIG. 12 depicts another three-dimensional oscillator composed of grid amplifiers separated by a resonant distance θ according to the present disclosure.

The three-dimensional structure shown in FIG. 6 may also be configured as an oscillator array as shown in FIG. 12. where the input/output coupling can be achieved by rotating each of the grid amplifiers 10 with respect to the other grid amplifiers 10. With the grid amplifiers 10 rotated, the output polarization from one grid amplifier 10 will partly couple to the other grid amplifier 10, with the coupling depending on the angle of rotation. The rotation of the grid amplifiers 10 is an easy way to couple the grid amplifiers 10 together to achieve oscillation and it also allows the coupling strength grid amplifiers 10 to be controlled by varying the rotation angle of grid amplifiers 10.

Referring to FIG. 12, another exemplary embodiment of a three-dimensional oscillator 225 composed of four "grid" amplifiers 10 separated by distance d, total reflector 20 and partial reflector 30 is shown. The total reflector 20 and the partial reflector 30 may be used to terminate sides of the three-dimensional oscillator 225 in order to provide feedback to initiate oscillations. The output of the three-dimensional oscillator 225 consists of the power transmitted through the partial reflector 30.

The grid amplifiers 10 of FIG. 12 may, for example, contain a two dimensional array of two terminal active devices, such as, for example, IMPATT, Gunn or tunnel diodes or three terminal active devices, such as, for example, FET transistors. As stated above, the grid amplifiers 10 are well known in the art and are not discussed in great detail herein for clarity purposes.

Figure 13:
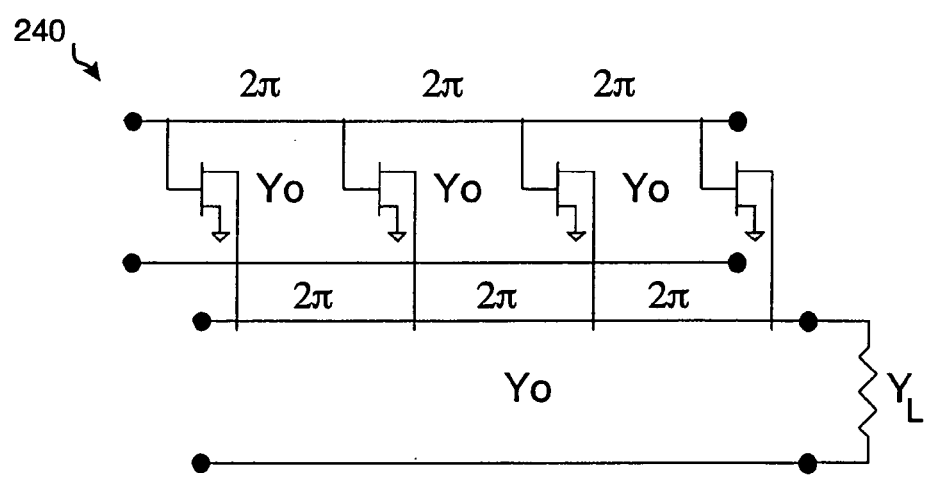
FIG. 13 depicts a schematic diagram of the three-dimensional oscillator shown in FIG. 12 wherein the grid amplifiers comprise two-dimensional array of three terminal devices.

Referring to FIG. 13, schematic diagram 240 of the three-dimensional oscillator 225 with grid amplifiers 10 composed of a two dimensional array of three terminal devices is shown. There are two sets of loaded transmission lines 17 and 18, one for the input (gate) side and one for the output (drain) side. As above, the lengths of transmission line between grid amplifiers 10 are multiples of half a wavelength so that the inputs and outputs of the three terminal devices in the grid amplifiers 10 appear in parallel. For the gate circuit, this creates equal voltages across all of the gates, and on the drain circuit, power from each of the transistors adds in phase, delivering the sum power to the load $Y_L$.

This disclosure is not limited to four grid amplifiers 10 within the three-dimensional oscillator 225 as depicted in FIG. 12. One skilled in the art would understand that there could be a plurality of grid amplifiers 10 within the three-dimensional oscillator 225.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. A three-dimensional power combiner comprising:
    a plurality of grid amplifiers, each having a major surface, the plurality of grid amplifiers are arranged along an axis that is perpendicular to the major surface of each grid amplifier and spatially separated from each other by a selected resonant distance to generate a standing wave between adjacent grid amplifiers.

2. The three-dimensional power combiner of claim 1, wherein each grid amplifier comprises a plurality of two terminal devices disposed on the major surface and arranged in a two dimensional array.

3. The three-dimensional power combiner of claim 1, wherein each grid amplifier comprises a plurality of three terminal devices disposed on the major surface and arranged in a two dimensional array.

4. The three-dimensional power combiner of claim 1, further comprising:
    a total reflector having a major surface and disposed along the axis that is perpendicular to the major surface of the total reflector; and
    a partial reflector having a major surface and disposed along the axis that is perpendicular to the major surface of the partial reflector, wherein the plurality of grid amplifiers are disposed between the total reflector and the partial reflector.

5. The three-dimensional power combiner of claim 1, wherein said resonant distance is a multiple of half a wavelength distance between said adjacent grid amplifiers and a propagation constant.

6. The three-dimensional power combiner of claim 1, wherein the grid amplifiers are rotated at an angle along the axis.

7. A method for efficiently combining power from a large number of active devices, said method comprising:
    selecting a plurality of grid amplifiers each having a major surface;
    arranging the plurality of grid amplifiers along an axis that is perpendicular to the major surface of each grid amplifier;
    selecting a resonance distance; and
    spatially separating said plurality of grid amplifiers by the resonant distance to generate a standing wave between adjacent grid amplifiers.

8. The method of claim 7, wherein each grid amplifier comprises a plurality of two terminal devices disposed on the major surface and arranged in a two dimensional array.

9. The method of claim 7, wherein each grid amplifier comprises a plurality of three terminal devices disposed on the major surface and arranged in a two dimensional array.

10. The method of claim 7, further comprising:
    arranging a total reflector having a major surface along the axis that is perpendicular to the major surface of the total reflector; and
    arranging a partial reflector having a major surface along the axis that is perpendicular to the major surface of the partial reflector, wherein the plurality of grid amplifiers are arranged between the total reflector and the partial reflector.

11. The method of claim 7, wherein said resonant distance is a multiple of half a wavelength distance between said adjacent grid amplifiers and a propagation constant.

12. The three-dimensional power combiner of claim 7, further comprising rotating the grid amplifiers at an angle along the axis.

* * * * *